United States Patent
Blomgren et al.

(10) Patent No.: US 6,571,378 B1
(45) Date of Patent: May 27, 2003

(54) METHOD AND APPARATUS FOR A N-NARY LOGIC CIRCUIT USING CAPACITANCE ISOLATION

(75) Inventors: James S. Blomgren, Austin, TX (US); Terence M. Potter, Austin, TX (US); Stephen C. Horne, Austin, TX (US); Michael R. Seningen, Austin, TX (US); Anthony M. Petro, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 360 days.

(21) Appl. No.: 09/587,729

(22) Filed: Jun. 5, 2000

Related U.S. Application Data

(63) Continuation of application No. 09/209,967, filed on Dec. 10, 1998, now Pat. No. 6,124,735.
(60) Provisional application No. 60/069,250, filed on Dec. 11, 1997.

(51) Int. Cl.[7] .............................................. G06F 17/50
(52) U.S. Cl. ...................................................... 716/10
(58) Field of Search ........................ 327/158; 326/121; 716/2, 4, 5, 6, 10

(56) References Cited

U.S. PATENT DOCUMENTS

| 5,483,181 A | * | 1/1996 | D'Souza ..................... 326/121 |
| 5,661,675 A | | 8/1997 | Chin et al. |
| 5,781,055 A | * | 7/1998 | Bhagwan ..................... 327/158 |
| 5,886,541 A | | 3/1999 | Asato |
| 5,933,038 A | | 8/1999 | Klass |
| 5,959,465 A | * | 9/1999 | Beat ............................. 326/39 |
| 5,973,514 A | | 10/1999 | Kuo et al. |
| 6,011,410 A | | 1/2000 | Kim et al. |

OTHER PUBLICATIONS

U.S. patent application "Method and Apparatus for a 1 of N Signal," Inventors: Blomgren, et al., Ser. No. 09/019,278, filed on Feb. 05, 1998.

* cited by examiner

*Primary Examiner*—Matthew Smith
*Assistant Examiner*—Thuan Do
(74) *Attorney, Agent, or Firm*—Booth & Wright, LLP; Matthew J. Booth; Karen S. Wright

(57) ABSTRACT

A logic device with improved capacitance isolation and a design methodology that reduces parasitic capacitance is disclosed. The logic device includes a virtual ground node, a plurality of input signals that may be individual wires of one or more N-NARY signals, and two or more discharge paths. Each discharge path includes an evaluate node, one or more transistors gated by the input signals, and one or more intermediate nodes, one of which is coupled to the virtual ground node. In one embodiment, the discharge paths are perfectly isolated from each other for every combination of inputs. In another embodiment, intermediate nodes on discharge paths maybe electrically coupled to the evaluation path only at the intermediate node coupled to the virtual ground node.

15 Claims, 7 Drawing Sheets

METHOD AND APPARATUS FOR A N-NARY LOGIC CIRCUIT USING CAPACITANCE ISOLATION

This application claims the benefits of the earlier filed U.S. Provisional Application Ser. No. 60/069,250, filed Dec. 11, 1997, which is incorporated by reference for all purposes into this specification. Additionally, this application is a continuation of U.S. Pat. App. Ser. No. 09/209,967, now U.S. Pat. No. 6,124,735, filed Dec. 10, 1998, which is incorporated by reference for all purposes into this specification.

BACKGROUND OF THE INVENTION

1. Field of the Invention

The present invention relates to electronic devices, and more specifically to low-power, high-speed execution of algorithms in logic gates within electronic devices.

2. Description of Related Art

The majority of modern microprocessors are designed using a circuit family known as CMOS. In practice, CMOS circuits consume power only when switching states. CMOS consists of two kinds of transistors: P-channel and N-channel field effect transistors, or PFETs and NFETs, typically fabricated in roughly equal numbers on a common substrate. Static CMOS logic gates are constructed so that either the PFETs or the NFETs conduct, creating a path either to power or to ground, respectively. Except for the transient when the transistors are switching, PFETs and NFETs in a static CMOS circuit do not both conduct simultaneously. A CMOS logic gate consumes practically no DC power, and consumes AC power only when switching.

Since most chips initially constructed using this technology are slow by today's standards (one megahertz or less), most of the time signals were not switching, so the power consumed by a CMOS circuit was very low. Many portable devices were made possible by this technology. CMOS gained rapid favor for its ease of construction and simple design rules, as well as its tolerance for noise.

However, current applications of CMOS technology commonly run at very high clock rates of 200 megahertz or more. Ignoring technology differences, a circuit that used to burn little power at 1 megahertz will burn 200 times that amount when it is run at 200 MHz. Designing systems that incorporate processors and support logic that consume this much power is a problem, both in getting the power in, and getting the resulting heat out.

One well-known CMOS design style with little DC power consumption is the non-inverting dynamic logic family. Non-inverting dynamic logic gates include an internal "evaluate" node that is precharged during one portion of a clock cycle, and then may (depending on input values) be discharged during a later portion of the clock cycle. The evaluate node then provides its voltage as an output from the logic gate. The power consumption of a dynamic CMOS circuit is equal to $fC_L(V_{DD}-V_{SS})^2$, where f is the frequency, $C_L$ is the switching capacitance, and $V_{DD}-V_{SS}$ defines the switching voltage range.

Another logic family with little DC power consumption is the new N-NARY logic family. N-NARY logic is more fully described in the co-pending application, U.S. Pat. App. Ser. No. 09/019,278, filed Feb. 5, 1998, entitled "Method and Apparatus for a 1 of N Signal" (hereinafter "N-NARY Patent"), which is incorporated by reference into this application. Due to the nature of the N-NARY style, various implementations for a given logic function exist, each of which differs in the structure of the N-tree. Different N-tree structures may have different amounts of parasitic capacitance, and thus different performance characteristics. It is the parasitic capacitance of the N-tree structure that slows down the evaluate transition of the logic gate.

The effect of parasitic or unwanted capacitance on gate speed is often difficult to quantify because there are actually two factors involved. The first (and more straightforward) factor is the amount of extra charge stored on the parasitic capacitance. The second factor, which is more difficult to quantify, is the additional amount of time it takes to conduct this additional charge to ground. This amount of time is related to the effective resistance of the path that is discharging the parasitic capacitance. The effective resistance is difficult to estimate because of the non-linear nature of the resistance of the transistors conducting the charge. The presence of extra charge in an N-tree causes higher voltages on the sources and drains of the transistors involved in conducting the charge to ground. Thus, the gate-source voltage of these transistors is reduced and their conductivity is degraded.

In general, it is most desirable to reduce parasitic capacitance that has a relatively long discharge path to ground. This is because the charge associated with this kind of capacitance will have the longest lasting effect on the conductivity of the transistors attempting to discharge the path. Of course, reducing any parasitic capacitance is beneficial, but sometimes a designer has to make a choice about which particular capacitance to reduce in a gate.

Another important effect of parasitic capacitance in CMOS logic gates and especially in dynamic logic gates is the unintended discharge of a node via charge sharing. In this case a certain node (such as the top of an N-tree stack) is intended to stay at a high voltage (i.e., not discharge). However, the node can be partially or largely discharged by having its charge drawn away by a parasitic capacitance with a lower voltage that is switched on to the node in question. The amount of voltage loss is related to the relative amounts of charge on the nodes involved in the transaction. Charge sharing is minimized by either ensuring the parasitic capacitance is at a benign voltage level or by minimizing the size of the parasitic capacitance.

Parasitic capacitance in CMOS gates comes from various sources. One source is the capacitance of the wires that connect together the various transistors in the gate. Another source is the transistor source/drain capacitance associated with each transistor. Source drain capacitance is present whether a gate is turned on or off Another source is the channel capacitance of a transistor. This is the capacitance of the channel region of a transistor that is turned on or is in the conducting state. In addition to these static capacitance sources, the voltage waveforms on transistor gates can couple charge onto the source/drain nodes of transistors. Specifically, when a dynamic gate input rises, positive charge is transferred from the gate to this transistor's source and drain regions.

The parasitic capacitance presented by the drain of a transistor that is in the on state is large because it is comprised of that transistor's drain capacitance, its channel capacitance, the source capacitance (seen "through" the gate) and whatever other capacitance is attached to that transistor's source terminal. This is because the transistor drain and source terminals are connected by the resistance of the channel when the transistor is in the on state. Because of this, it is important to keep the parasitic transistors attached to an evaluate or discharge path turned off.

Capacitance isolation is the technique of improving gate delay and reducing charge sharing by isolating parasitic or unwanted capacitance from the part of the gate circuit actively involved in switching an output. This technique can be exploited to a great degree in the new N-NARY logic family to reduce gate size, improve gate speed, and reduce the severity of unwanted charge sharing. In particular, while not obvious, it is often possible to reduce unwanted parasitics in N-NARY gates by adding transistors in a judicious way, thereby increasing gate speed and/or overall gate area. The extent to which this design tradeoff may be made is unique to the N-NARY encoding of signals in this logic family.

The capacitance isolation technique discussed herein is notas applicable to traditional static CMOS logic because of the complimentary nature of the p- and n-transistor networks in a traditional CMOS gate. In the general case, the transistors that are the compliment of the active or conducting transistors have parasitic capacitance that is exposed to the output of the gate. PMOS transistors in particular have significant parasitic capacitance due to their larger size.

The technique is also applicable to traditional dual-rail dynamic logic, though the opportunities are not as great as in general N-NARY dynamic logic due to the larger fraction of turned-off transistors in general N-NARY logic.

SUMMARY

The present invention comprises a logic device with improved capacitance isolation, and a design methodology that reduces parasitic capacitance, allowing designers to achieve specific design timing and output goals with smaller circuits. The logic device further comprises a virtual ground node that is electrically coupled to ground during the evaluation cycle, a plurality of input signals, and two or more discharge paths. Each discharge path includes an evaluate node, one or more transistors wherein each transistor is gated by one of the input signals, and one or more intermediate nodes, one of which is coupled to the virtual ground node. In one embodiment, each input signal further comprises an input wire ozone or more N-NARY input signals. In one embodiment, the discharge paths are perfectly isolated from each other during the evaluation cycle for every possible combination of the input signals. In another embodiment, the discharge paths further comprise an evaluation path and a non-evaluation path. In this embodiment, the non-evaluation path further comprises an evaluate node and at least two intermediate nodes where one of the intermediate node is coupled to the virtual ground node. During the evaluation cycle for at least one combination of said input signals, the evaluate node of the non-evaluation path is electrically isolated from the evaluation path and the two intermediate nodes are electrically coupled to the evaluation path.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a digital circuit or logic family constructed in such a way that parasitic internal gate capacitance can be significantly reduced, allowing logic gates to perform their function faster, and allowing these logic functions to be built in less area than would otherwise be possible. In addition the present invention comprises design concepts and a design methodology that can be applied to all logic functions to decrease undesirable parasitic capacitance, thus potentially improving the performance of the logic gate. This disclosure describes numerous specific details that include specific structures, circuits, and logic functions in order to provide a thorough understanding of the present invention. One skilled in the art will appreciate that one may practice the present invention without these specific details.

Poor Capacitance Isolation: Structure of Intermediate Nodes

Figure 1:
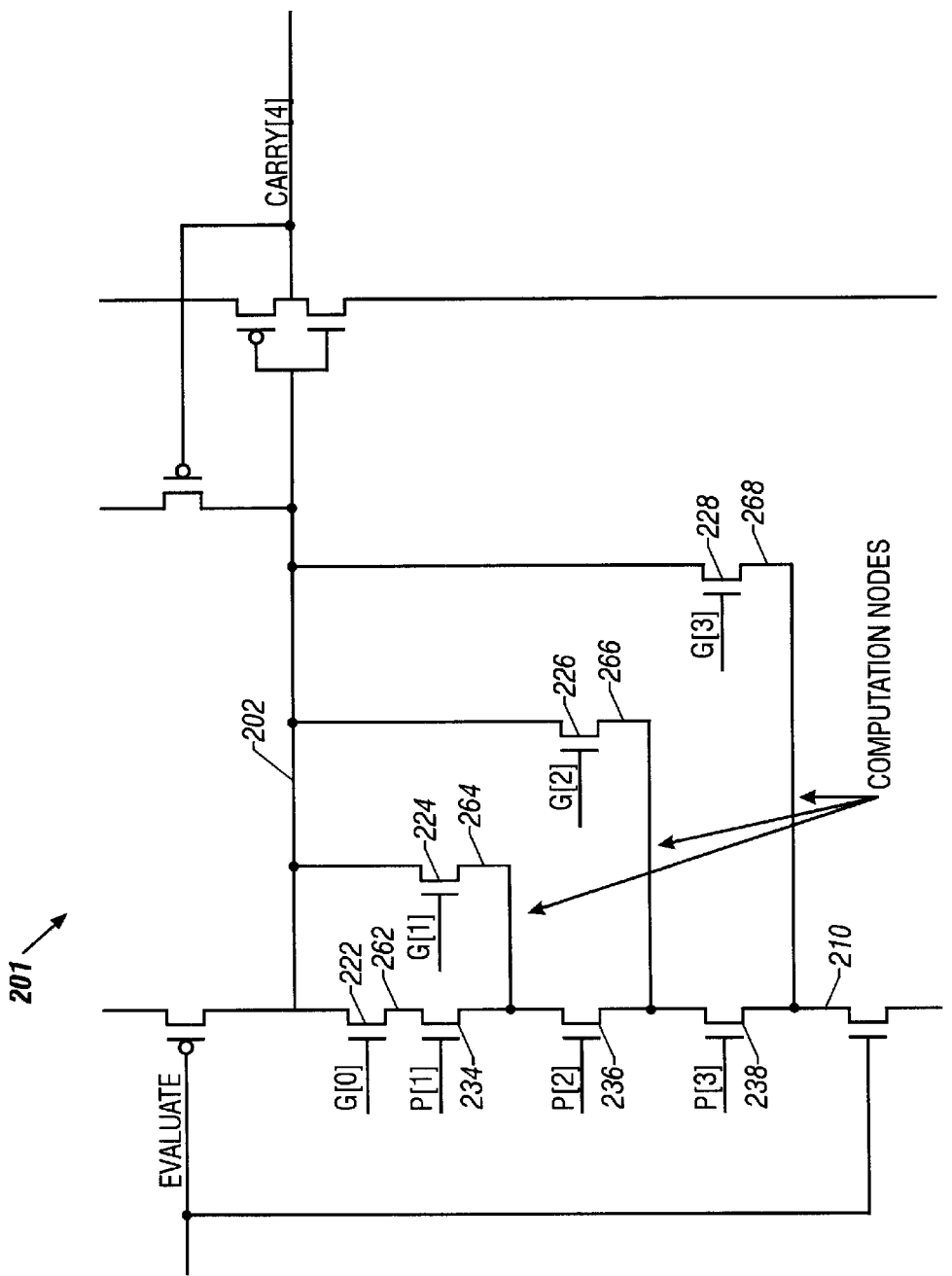
FIG. 1 is a N-NARY logic gate where some discharge paths have poor capacitance isolation.

FIG. 1 shows an N-NARY logic gate 201 according to one embodiment of the present invention. As described in the N-NARY Patent, N-NARY logic gates are built around signals that have multiple (two or more) wires. The signal values are encoded so that at most one wire of the signal is active at a time. An N-NARY gate receives such N-NARY inputs and produces N-NARY outputs. Additionally, the intermediate (dynamic) nodes in the gate are also N-NARY in nature.

The N-NARY logic gate in FIG. 1 includes transistors 222, 224, 226, and 228. Transistors 222, 224, 226, and 228 are each gated by a wire from a distinct input signal "G". For example, the "G" wires may indicate that a "generate" state is achieved at various cells in a multi-cell adder. G[0] may be a wire that has a high voltage when the least-significant (first) cell in an adder generates a carry; G[1] may be a wire that has a high voltage when a second cell in an adder generates a carry; G[2] may be a wire that has a high voltage when a third cell in an adder generates a carry; and G[3] may be a wire that has a high voltage when a fourth cell in an adder generates a carry. Similarly, the logic gate includes transistors 234, 236, and 238. Transistors 234, 236, and 238 are each gated by a wire from a distinct input signal "P". For example, the "P" wires may indicate that a "propagate" state is achieved at various cells in a multi-cell adder. Without consideration of the first cell in an adder, P[1] may be a wire that has a high voltage when a second cell in an adder propagates a carry; P[2] may be a wire that has a high voltage when a third cell in an adder propagates a carry; and P[3] may be a wire that has a high voltage when a fourth cell in an adder propagates a carry.

The evaluate node 202 is coupled to a virtual ground node 210 via several discharge paths. Each of the discharge paths includes several transistors in a transistor "stack." For example, as shown in FIG. 1, one discharge path includes transistors 222, 234, 236, and 238. A second discharge path includes transistors 224, 236, and 238. A third discharge path includes transistors 226 and 238. A fourth discharge path includes transistor 228.

As shown in FIG. 1, the logic gate 201 also includes several intermediate nodes. For example, intermediate node 262 is coupled to evaluate node 202 via transistor 222 which is gated by wire G[0], and to intermediate node 264 via transistor 234 that is gated by wire P[1]. Intermediate node 264 is coupled to evaluate node 202 via transistor 224 which is gated by wire G[1], to intermediate node 262 via transistor 234 which is gated by wire P[1], and to intermediate node 266 via transistor 236 which is gated by wire P[2]. Intermediate node 266 is coupled to evaluate node 202 via transistor 226 which is gated by wire G[2], to intermediate node 264 via transistor 236 which is gated by wire P[2], and to intermediate node 268 via transistor 238 which is gated by wire P[3]. Intermediate node 268 is coupled to evaluate node 202 via transistor 228 which is gated by wire G[3], and to intermediate node 266 via transistor 238 which is gated by wire P[3].

Poor Capacitance Isolation: Non-evaluation Paths

From a design perspective, some of the potential discharge paths in the N-NARY logic gate of FIG. 1 have poor capacitance isolation. The various inputs select a discharge path, which includes a stack of transistors, and a set of nodes intervening between adjacent transistors in the stack. In this disclosure, the discharge path that is selected by the inputs is called the "evaluation path." Within an evaluation path, the intervening nodes between adjacent transistors in the stack are referred to as "computation nodes." Regardless of which discharge path is selected as the evaluation path, however, other intermediate nodes maybe coupled to the computation nodes by other input signals that can add sufficient parasitic capacitance to slow down the gate evaluation.

For example, as shown in FIG. 1, when gate inputs G[1], P[2], and P[3] are high, the selected discharge path is through transistors 224, 236, and 238. If G[0] is also high, but P[1] is low, then transistor 222 is conducting and transistor 234 is not conducting. Therefore, intermediate node 262 is not on an evaluation path, but is coupled to the evaluation path. The extra capacitance added from node 262 must be discharged via the evaluation path, and the time it takes for the extra capacitance to discharge adds latency to the gate.

On the other hand, not all turned-on transistors outside the selected evaluation path create additional latency caused by parasitic capacitance. Consider the example where G[0], P[1], P[2], and P[3] are high. In this case, the evaluation path includes transistors 222, 234, 236, and 238. If G[1] is high, then two evaluation paths have effectively been simultaneously selected, one through transistors 222, 234, 236, and 238, and another through transistors 224, 236, and 238. In this example, transistor 224 does not couple an undesired intermediate node to the evaluation path that must be discharged along the evaluation path. Instead, turning on transistor 224 creates a parallel evaluation path. Parallel evaluation paths almost always speed up the gate because the additional conduction more than compensates for the additional capacitance.

As these examples demonstrate, when undesirable intermediate nodes are coupled to the evaluation path, that do not create a parallel evaluation path but rather, must be discharged though the evaluation path, unwanted capacitance and additional latency can result.

Good Capacitance Isolation: Structure of Intermediate Nodes

Figure 2:
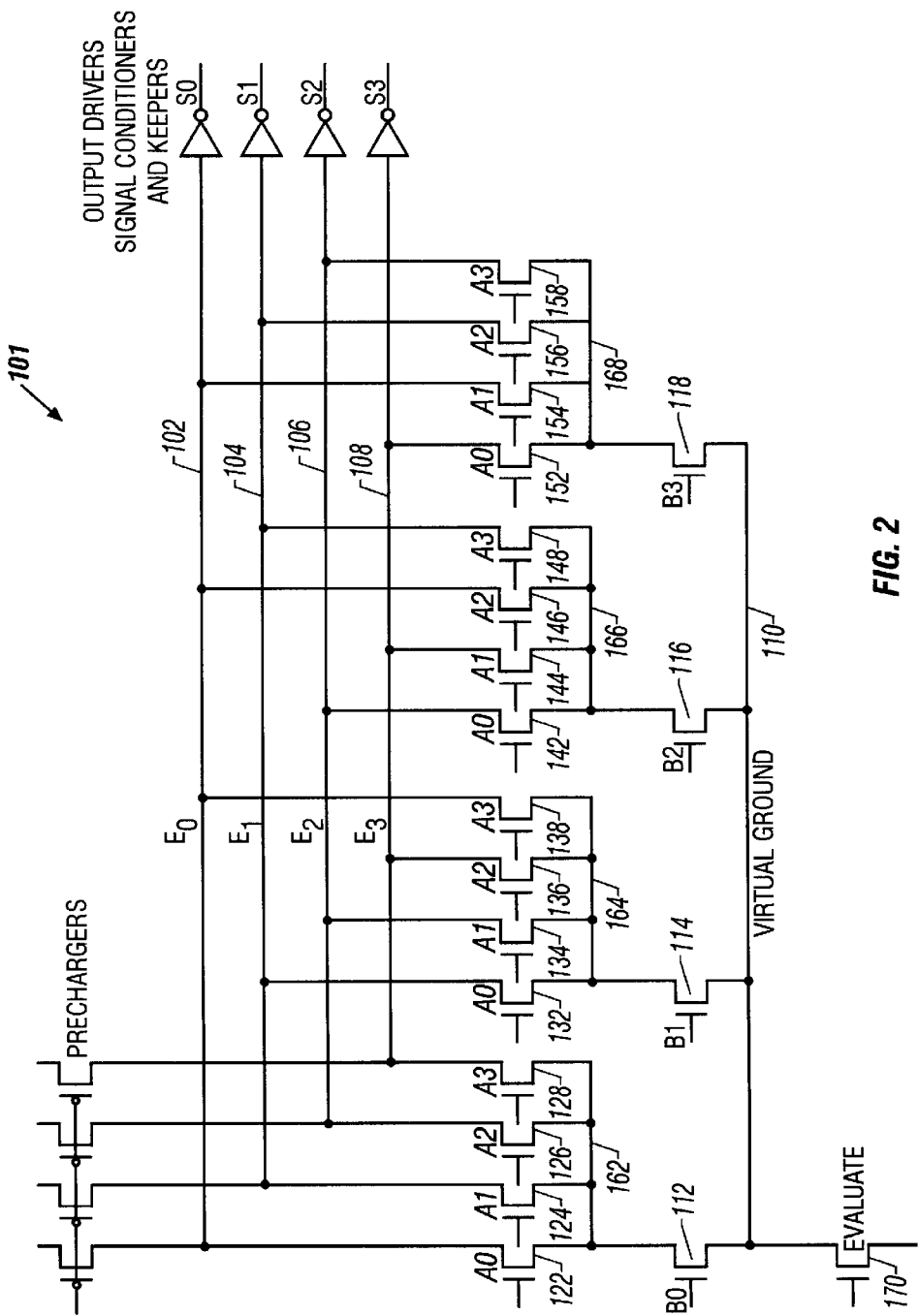
FIG. 2 is a N-NARY 1 of 4 adder gate with perfect capacitance isolation.

Referring now to FIG. 2, an N-NARY logic device according to one embodiment of the present invention is shown. The logic gate 101 shown in FIG. 2 has perfect capacitance isolation. Capacitance isolation refers to the ability of a gate to isolate parasitic capacitance from the evaluation path. A gate that has perfect capacitance isolation has a path from the evaluate node to the virtual ground node with no node gated onto this path that is not part of the evaluation path. In this disclosure, such a path is said to be "perfectly isolated" from all other discharge paths.

As shown in FIG. 2, four internal evaluate nodes 102–108 are each coupled to a virtual ground node 110 via several parallel paths. Each of the parallel paths includes several transistors in a transistor stack. As shown in FIG. 2, the logic gate also includes several intermediate nodes. For example, intermediate node 162 is coupled to internal evaluate node 102 via transistor 122, to internal evaluate node 104 via transistor 124, to internal evaluate node 106 via transistor 126, and to internal evaluate node 108 via transistor 128.

Transistors 122, 124, 126, and 128 are collectively referred to as an N-NARY group of transistors. The transistors of an N-NARY group have a common conductivity type—all are n-channel, or all are p-channel. For various reasons explained in the N-NARY Patent, n-channel devices are preferred in the evaluate paths. Each transistor in an N-NARY group is gated by a distinct wire of an N-NARY signal. For example, transistors 122, 124, 126, and 128 are collectively gated by an N-NARY signal referred to as an "A" input signal. Also, each transistor in an N-NARY group shares one node connected to one of the non-gating terminals (i.e., either the source or drain) of the transistors in the N-NARY group. For example, the source terminals of transistors 122, 124, 126, and 128 are all coupled to the intermediate node 162.

Intermediate node 164 is coupled to internal evaluate node 102 via transistor 138, to internal evaluate node 104 via transistor 132, to internal evaluate node 106 via transistor 134, and to internal evaluate node 108 via transistor 136. Transistors 132, 134, 136, and 138 are n-channel, and each is gated by a distinct wire of the "A" input signal. The source terminals of transistors 132, 134, 136, and 138 are all coupled to the intermediate node 164.

Intermediate node 166 is coupled to internal evaluate node 102 via transistor 146, to internal evaluate node 104 via transistor 148, to internal evaluate node 106 via transistor 142, and to internal evaluate node 108 via transistor 148. Transistors 142, 144, 146, and 148 are n-channel, and each is gated by a distinct wire of the "A" input signal. The source terminals of transistors 142, 144, 146, and 148 are all coupled to the intermediate node 166.

Intermediate node 168 is coupled to internal evaluate node 102 via transistor 154, to internal evaluate node 104 via transistor 156, to internal evaluate node 106 via transistor 158, and to internal evaluate node 108 via transistor 152. Transistors 152, 154, 156, and 158 are n-channel, and each is gated by a distinct wire of the "A" input signal. The source terminals of transistors 152, 154, 156, and 158 are all coupled to the intermediate node 168.

The N-NARY logic gate of FIG. 2 is designed so that when the input signal A has a value of 0, certain connections are made and other connections are excluded. In particular, when the input signal A has a value of 0, node 162 is connected to internal evaluate node 102 via transistor 122, and to no other internal evaluate node; node 164 is connected to internal evaluate node 104 via transistor 132, and to no other internal evaluate node; node 166 is connected to internal evaluate node 106 via transistor 142, and to no other internal evaluate node; and node 168 is connected to internal evaluate node 108 via transistor 152, and to no other internal evaluate node. The connections that are desired belong to the "evaluation path," while the connections that are not desired belong to "non-evaluation paths."

Similarly, when the input signal A has a value of 1, node 162 is connected to internal evaluate node 104 via transistor 124, and to no other internal evaluate node; node 164 is connected to internal evaluate node 106 via transistor 134, and to no other internal evaluate node; node 166 is connected to internal evaluate node 108 via transistor 144, and to no other internal evaluate node; and node 168 is connected to internal evaluate node 102 via transistor 154, and to no other internal evaluate node.

Similarly, when the input signal A has a value of 2, node 162 is connected to internal evaluate node 106 via transistor 126, and to no other internal evaluate node; node 164 is connected to internal evaluate node 108 via transistor 136, and to no other internal evaluate node; node 166 is connected to internal evaluate node 102 via transistor 146, and to no other internal evaluate node; and node 168 is connected to internal evaluate node 104 via transistor 156, and to no other internal evaluate node.

Finally, when the input signal A has a value of 3, node 162 is connected to internal evaluate node 108 via transistor 128, and to no other internal evaluate node; node 164 is connected to internal evaluate node 102 via transistor 138, and to no other internal evaluate node; node 166 is connected to internal evaluate node 104 via transistor 148, and to no other internal evaluate node; and node 168 is connected to internal evaluate node 106 via transistor 158, and to no other internal evaluate node. Once a discharge path is selected to be the evaluation path by a combination of N-NARY signal inputs, only those transistors on the evaluation path are able to discharge. In other words, there is no combination of inputs that couples any node onto the evaluation path that is not intended to be part of the evaluation path. This is an important concept. Consider the input combination that turns both transistors 122 and 112 on. In this case, the charge flows from the internal evaluate node 102 through transistors 122 and 112 to virtual ground 110. The internal evaluate node 102 also connects to transistors 138, 146, and 154, but because these transistors are off when transistor 122 is on, the nodes 164–168 below them are not connected to internal evaluate node 102. The N-NARY gate design in FIG. 2 performs the addition function with excellent capacitance isolation within the evaluate stack as well as at the top of the stack, which increases the speed of the gate. The evaluation paths in the FIG. 2 addition gate are perfectly isolated from all other discharge paths when the transistors on the evaluation paths are conducting. Note that when the gate terminal of transistor 122 is asserted, the outputs S1, S2 and S3 (internal evaluate nodes 104–108) are each connected to one of the internal nodes, but because these outputs (internal evaluate nodes 104–108) are not asserted, charge need not be moved from their output nodes. In other words, where MOS transistors do not switch, there is no need to increase speed. This is another critical consideration because it is not necessary to isolate capacitance from any output node which is not asserted.

Good Capacitance Isolation: Structure of Input Signals

N-NARY logic has an inherent advantage over traditional logic when it comes to minimizing parasitic capacitance, due to the structure of the N-NARY 1-of-N signal. As shown in FIG. 2, transistors 122, 132, 142, and 152 are all gated by the same wire of the input signal A and in particular by wire A0. Consequently, when the input signal A has a value of 0, transistors 122, 132, 142, and 152 conduct. The input signal A is N-NARY; therefore, when one wire of input signal A has a high voltage, all remaining wires belonging to the input signal A have a low voltage. The low voltage on the remaining wires belonging to the input signal A cause transistors gated by wires A1–A3 to be off. As a result, transistors 124, 126, and 128 do not conduct; transistors 134, 136, and 138 do not conduct; transistors 144, 146, and 148 do not conduct; and transistors 154, 156, and 158 do not conduct.

Like the transistors gated by wire A0, the transistors 124, 134, 144, and 154 are all gated by wire A1 of the input signal A. Consequently, when the input signal A has a value of 1, transistors 124, 134, 144, and 154 conduct. The low voltage on the remaining wires belonging to the input signal A cause transistors gated by wires A0, A2, and A3 to be off. As a result, transistors 122, 126, 128, 132, 136, 138, 142, 146, 148, 152, 156, and 158 do not conduct.

Similarly, transistors 126, 136, 146, and 156 are all gated by wire A2 of the input signal A. Consequently, when the input signal A has a value of 2, transistors 126, 136, 146, and 156 conduct. The low voltage on the remaining wires belonging to the input signal A cause transistors gated by wires A0, A1, and A3 to be off. As a result, transistors 122, 124, 128, 132, 134, 138, 142, 144, 152, 154, and 158 do not conduct.

Finally, transistors 128, 138, 148, and 158 are all gated by wire A3 of the input signal A. Consequently, when the input signal A has a value of 3, transistors 128, 138, 148, and 158 conduct. The low voltage on the remaining wires belonging to the input signal A cause transistors gated by wires A0, A1, and A2 to be off. As a result, transistors 122, 124, 126, 132, 134, 136, 142, 144, 146, 152, 154, and 156 do not conduct. The very nature of N-NARY signals provides excellent opportunity to incorporate the capacitance isolation techniques disclosed herein, because at any point in time in an N-NARY gate, each N-NARY signal will have only one of N wires asserted, and there will be a relatively high concentration of "off" transistors, as compared to traditional logic designs. This high concentration of "off" transistors make it much more likely that undesirable internal nodes will not be coupled to the evaluation path anyway.

Good Capacitance Isolation: Structure of Internal Evaluate Nodes

As discussed previously in FIG. 2, internal evaluate nodes 102, 104, 106 and 108 are each coupled to intermediate nodes 162, 164, 166 and 168 such that no internal evaluate node is ever directly or indirectly electrically connected to more than one intermediate node (and thus to virtual ground 110) at any given time. Therefore, the capacitance at the selected internal evaluate node during the evaluate mode of the gate is minimized.

Other Capacitance Reduction Techniques: Reducing Output Wires, Reducing Number of Transistors, and Sharing Computation Nodes Among Outputs The gate 101 as illustrated in FIG. 2 is implemented using a single evaluate transistor 170 and a single evaluate stack (i.e., the selected path), but multiple outputs are constructed. It may at first appear that the additional interconnect wires associated with the use of 1-of-N signals may increase overall capacitance. In fact, however, the use of 1-of-N signals allows several advantages over other logic families in capacitance reduction. The exemplary embodiment of the present invention greatly reduces the number of p-channel devices vis-a-vis traditional CMOS circuits. At similar drive strengths, p-channel devices have far more internal capacitance than n-channel devices, and the elimination of nodes required for complimentary PMOS functions provides a drastic reduction in capacitance. The exemplary embodiment of the present invention also reduces the number of n-channel devices coupled to each internal node of each logic circuit. In tandem with the elimination of p-channel devices, this provides a much simpler, faster circuit. Moreover, the exemplary embodiment of the present invention virtually eliminates parallel switching paths by configuring transistors in parallel paths such that only one path can conduct at any time.

As shown in FIG. 2, the adder gate 101 design includes very few p-channel field effect transistors. Not all functions have the capacitance isolation quality of add, but the same design concepts used in the adder can be applied to a greater or lesser extent to all N-NARY logic functions. For example, FIGS. 3–6 are four logically identical designs of an AND gate in the N-nary logic family, but each has a different N-tree structure and each has a different degree of parasitic capacitance. The logic function implemented in the gates of FIGS. 3–6 is a 2-bit boolean AND function. The circuit is difficult to understand upon first inspection because the 2-bit boolean operands and the 2-bit boolean result are encoded as N-NARY 1-of-4 values. The following table shows the both the N-nary encoded and the 2-bit boolean truth table that the AND gates in FIGS. 3–6 implement.

TABLE 1

| A (1-of-4) | A (2-bit boolean) | B (1-of-4) | B (2-bit boolean) | A & B (1-of-4) | A & B (2-bit boolean) |
| --- | --- | --- | --- | --- | --- |
| 0 | 00 | 0 | 00 | 0 | 00 |
| 0 | 00 | 1 | 01 | 0 | 00 |
| 0 | 00 | 2 | 10 | 0 | 00 |
| 0 | 00 | 3 | 11 | 0 | 00 |
| 1 | 01 | 0 | 00 | 0 | 00 |
| 1 | 01 | 1 | 01 | 1 | 01 |
| 1 | 01 | 2 | 10 | 0 | 00 |
| 1 | 01 | 3 | 11 | 1 | 01 |
| 2 | 10 | 0 | 00 | 0 | 00 |
| 2 | 10 | 1 | 01 | 0 | 00 |
| 2 | 10 | 2 | 10 | 2 | 10 |
| 2 | 10 | 3 | 11 | 2 | 10 |
| 3 | 11 | 0 | 00 | 0 | 00 |
| 3 | 11 | 1 | 01 | 1 | 01 |
| 3 | 11 | 2 | 10 | 2 | 10 |
| 3 | 11 | 3 | 11 | 3 | 11 |

Each of the signals A and B are encoded in a 1-of-4 fashion; when A and B are valid they each have exactly one wire at a high voltage and three wires at a low voltage. Table 2 illustrates this encoding.

TABLE 2

| Value of A | A[3] | A[2] | A[1] | A[0] |
| --- | --- | --- | --- | --- |
| 0 | 0 | 0 | 0 | 1 |
| 1 | 0 | 0 | 1 | 0 |
| 2 | 0 | 1 | 0 | 0 |
| 3 | 1 | 0 | 0 | 0 |

Each version of the AND gate shown in FIGS. 3–6 implements the same logical function. However, the speed and/or area of the four different AND gates differs due to varying degrees of capacitance isolation.

Figure 3:
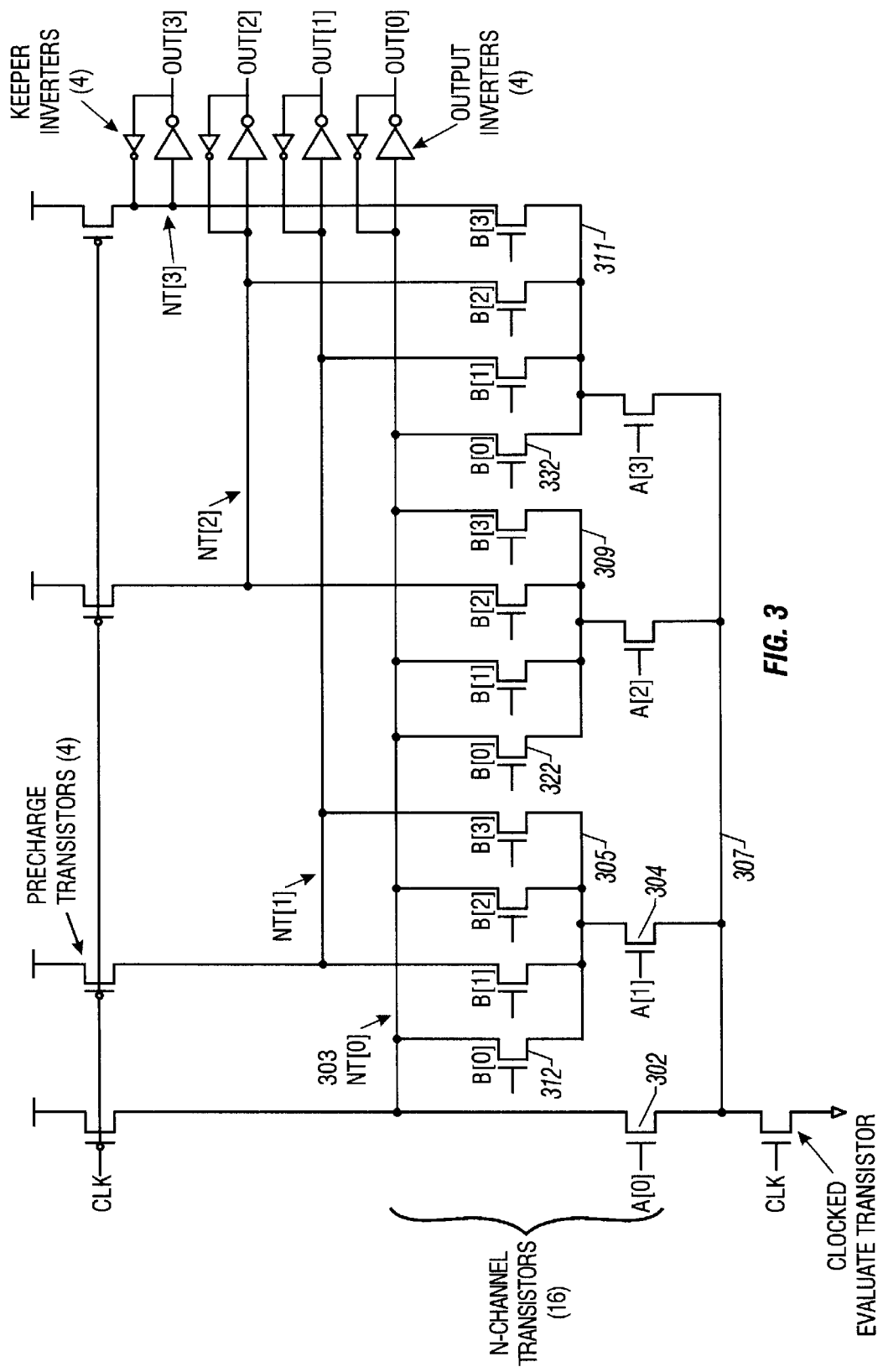
FIG. 3 is a N-NARY 1-of-4 AND gate with poor capacitance isolation.

FIG. 3 is the most straight forward implementation of the 2-bit boolean AND logic function in the N-NARY logic style. However, this implementation suffers from a parasitic capacitance problem for certain input combinations. For example, when A=1 and B=0, wires A1 and B0 are asserted, turning on transistors 304, 312, 322, and 332. The top-of-stack internal evaluate node NT[0] 303 is discharged through transistors 312 and 304 via intermediate computation nodes 305 and 307. However, because B=0 also turns on transistors 322 and 332, the charge on intermediate nodes 309 and 311 is exposed to the discharge path and must be conducted to ground in order for the internal evaluate node NT[0] 303 to evaluate low. Note that this gate has 16 N-channel transistors, not including the clocked evaluate transistor. There are 8 output gate transistors and 4 precharge transistors for a total of 28 transistors (not including the weak keepers on the output signals).

Figure 4:
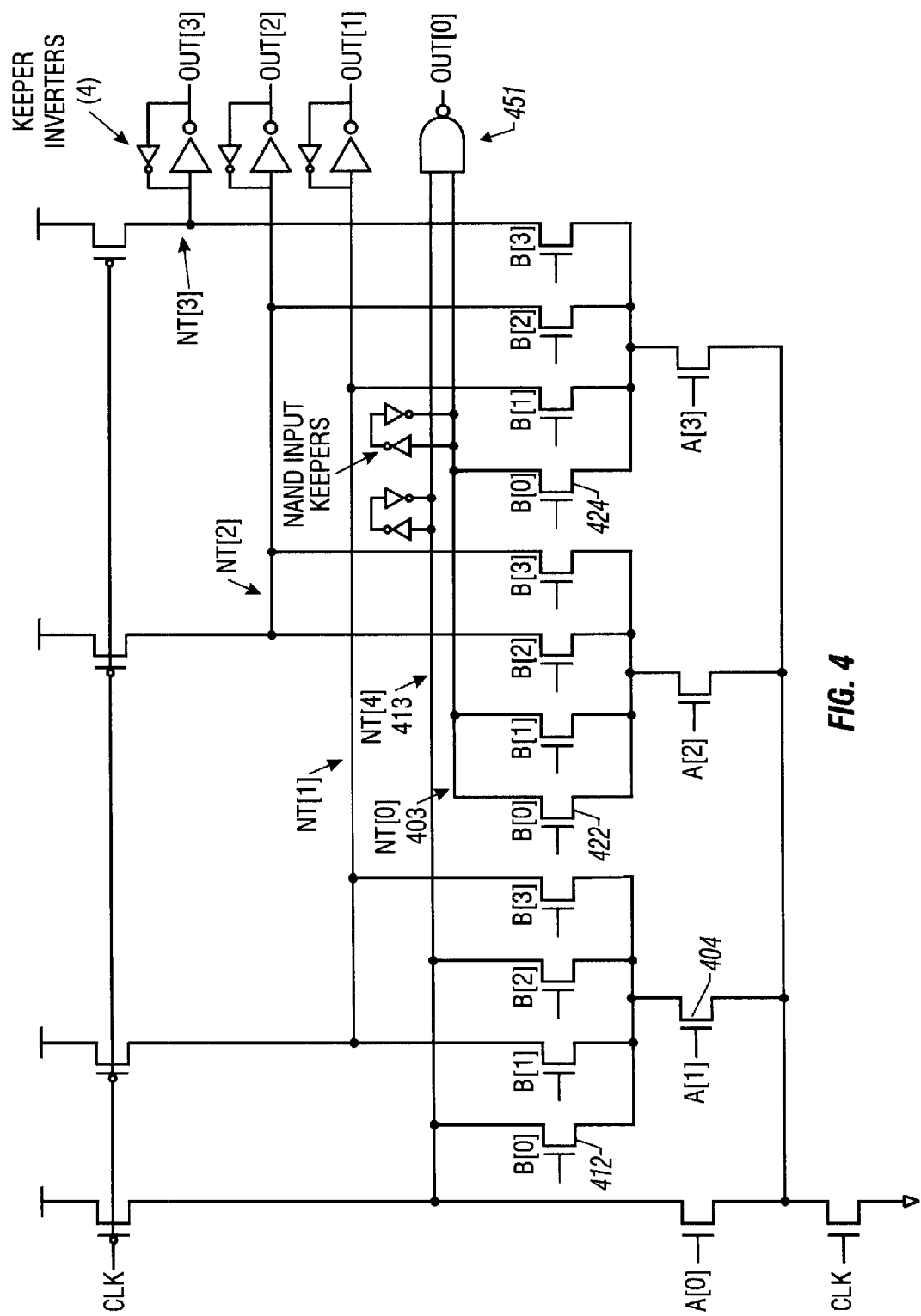
FIG. 4 is the N-NARY 1-of-4 AND gate of FIG. 3, with an internal evaluate node added in an attempt to decrease the parasitic capacitance and improve the performance of the gate.

FIG. 4 is an AND gate similar to that shown in FIG. 3, except that the parasitic capacitance on internal evaluate node NT[0] (303 in FIG. 3) has been reduced by adding another N-channel top-of-stack internal evaluate node NT[4] 413. In FIG. 3, node NT[0] 303 is poorly isolated because it has multiple devices attached to it that could be active simultaneously. Rather than connecting all of the devices directly to the inverter output driver as shown in FIG. 3, the devices have been segregated by creating two new internal evaluate nodes, NT[0] 403 and NT[4] 413. A static CMOS NAND device 451 is used to combine NT[0] 403 and NT[4] 413 into the intended output.

In FIG. 4, transistors 412 and 404, which conduct when A=1 and B=0, are connected to internal evaluate node NT[4] 413 instead of internal evaluate node NT[0] 403. The worst case parasitic capacitance on internal evaluate node NT[0] 403 in FIG. 4 is reduced from that in FIG. 3, because only two transistors attached to NT[0] 403 can be on at the same time (transistors 422 and 424, which conduct when B=0), as opposed to three transistors in the gate shown in FIG. 3.

While this capacitance isolation technique can be useful at times, in this case it actually resulted in slightly worse performance than the FIG. 3 gate (as will be seen below). This is because the NAND gate output, which is slower than an inverter output because the NAND gate has more p-transistors than the simple invertors used on the output lines, counteracted the slightly faster N-tree evaluation.

The AND gate shown in FIG. 4 has 16 N-channel transistors, like the gate shown in FIG. 3. It has 10 output transistors, however, and 5 precharge transistors for a total of 31 transistors.

Figure 5:
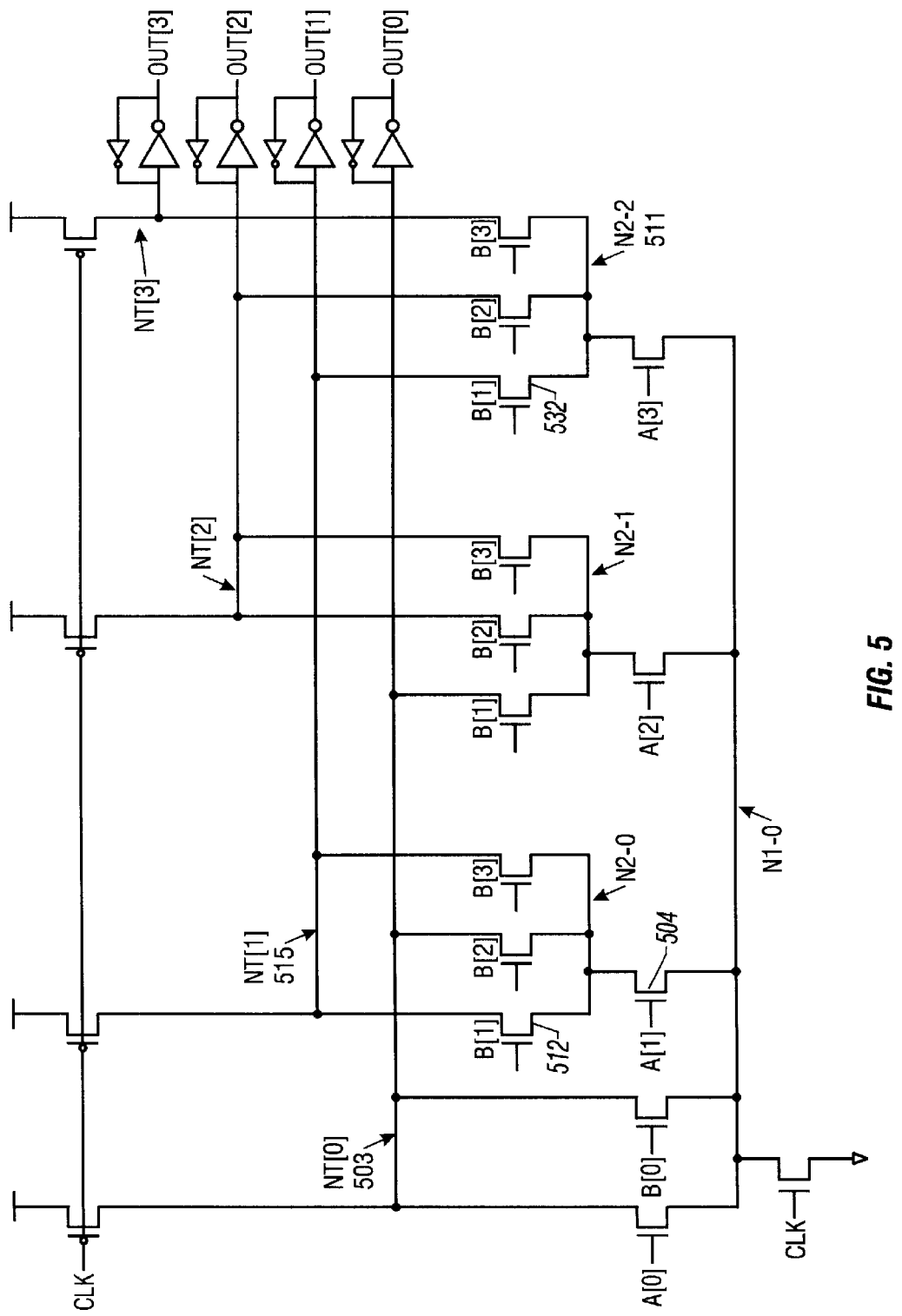
FIG. 5 is a N-NARY 1-of-4 AND gate with a different N-tree structure, with slightly improved capacitance isolation over the FIGS. 3 and 4 AND gates.

The AND gate shown in FIG. 5 uses only inverter outputs, but has a different N-tree structure than the first two gates. In FIG. 5, internal evaluate node NT[0] 503 never has a parasitic transistor turned on. However, internal evaluate node NT[1] 515 has a parasitic transistor turned on when B=1. For example, when A=1 and B=1, transistors 504, 512, and 532 conduct. The selected discharge path is from internal evaluate node NT[1] 515 through transistors 512 and 504. However, transistor 532 is also conducting, coupling intermediate node 511 to internal evaluate node NT[1] 515. Nevertheless, because this gate has no NAND output gates, it performs better than either of the gates shown in FIG. 3 and FIG. 4. This gate has only 14 N-channel transistors, 8 output transistors, and 4 precharge transistors for a total of 26 transistors.

Figure 6:
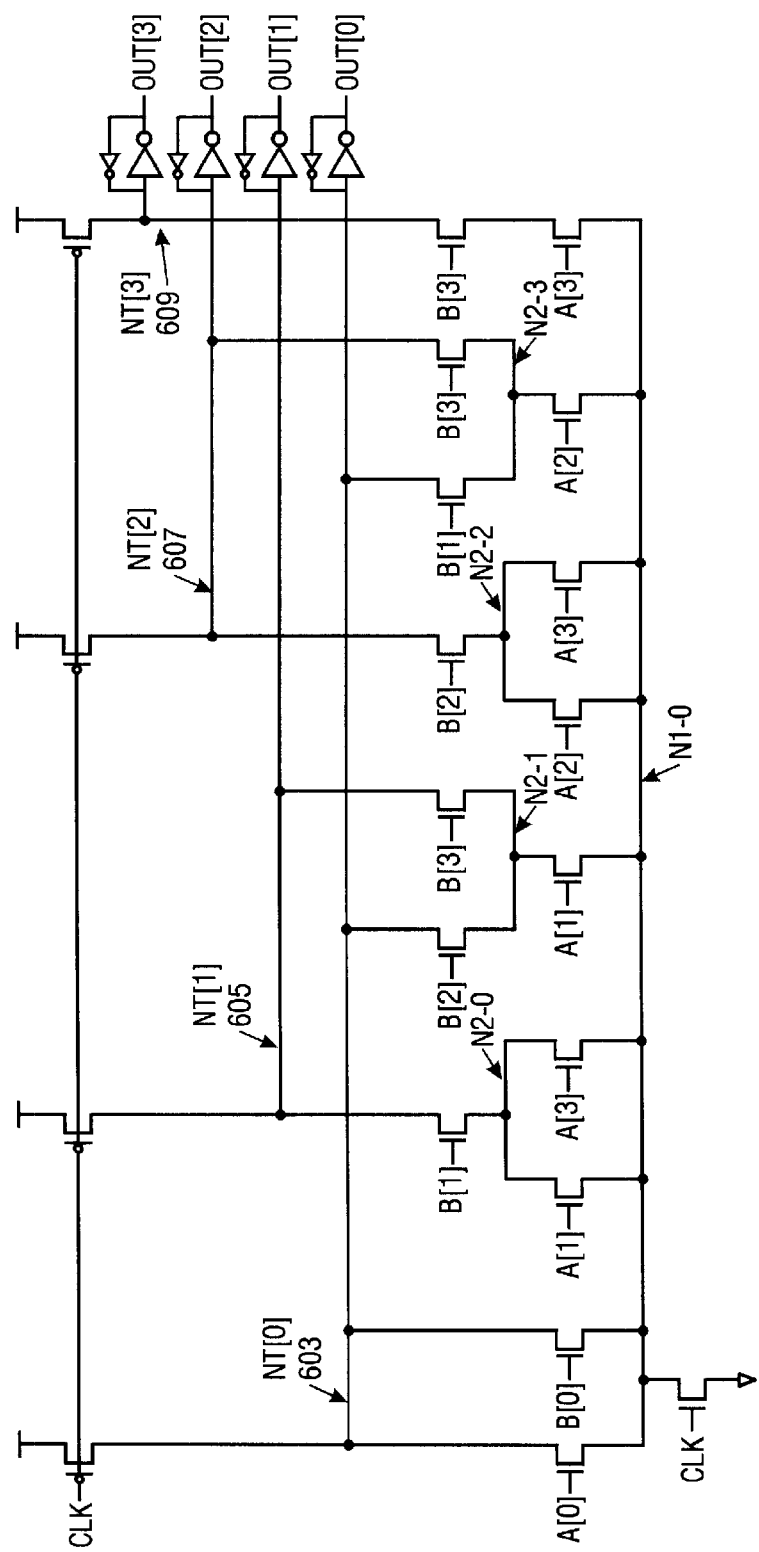
FIG. 6 is a N-NARY 1-of-4 AND gate with no parasitic capacitance (i.e., perfect capacitance isolation).

Finally, the gate shown in FIG. 6 has yet another N-tree structure but still has only output inverters (no NAND output gates). This implementation has no parasitic transistor capacitance at all; the only transistors that are turned on for each input combination are the transistors actively involved in pulling the top-of-stack internal evaluate nodes 603, 605, 607 and 609 down to ground. This gate has 16 N-channel transistors, 8 output transistors, and 4 precharge transistors for a total of 28 transistors. While the FIG. 6 gate has more transistors than the gate shown in FIG. 5, it actually performs better than the gate shown in FIG. 5 (i.e., it is smaller at the same speed).

Table 3 summarizes the performance of the FIG. 3–6 AND gates. These results were obtained by optimizing the transistor sizes in each gate to minimize total transistor width while meeting a specific delay goal (in this case, 150 ps while driving 200 fF of output load).

TABLE 3

| Gate Identifier | Total # Transistors | Total Transistor Width (microns) |
|---|---|---|
| FIG. 3 | 28 | 474 |
| FIG. 4 | 31 | 513 |
| FIG. 5 | 26 | 443 |
| FIG. 6 | 28 | 234 |

As shown in Table 3, the reduced parasitic capacitance in the gate shown in FIG. 6 allowed the FIG. 6 gate to achieve the specified goal with less overall transistor width even though this design did not have the smallest number of transistors.

Figure 7:
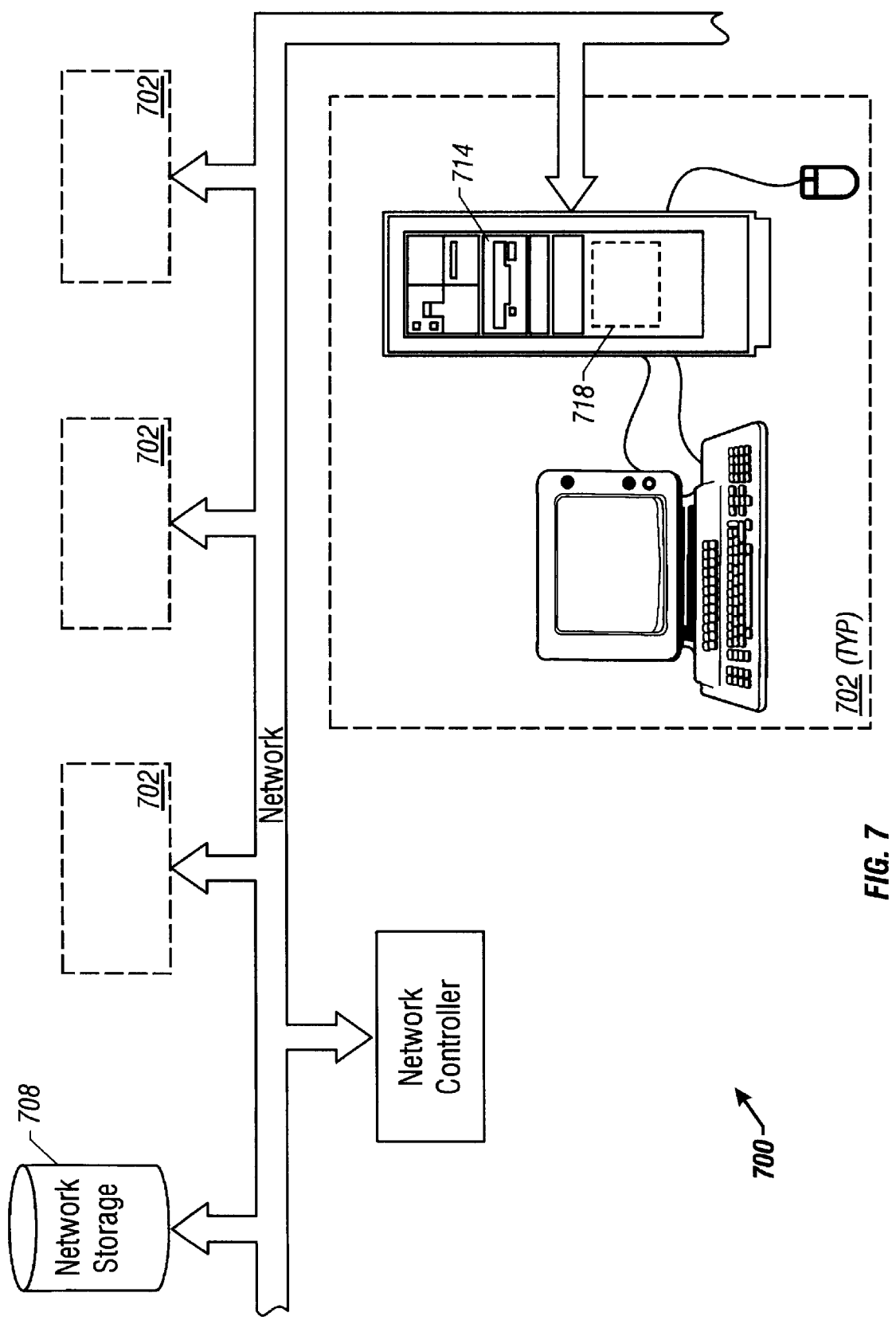
FIG. 7 illustrates a typical computer workstation suitable for computerized gate design, upon which the present invention can be practiced.

The techniques described herein that allow designers to reduce parasitic capacitance and thus improve gate performance, without changing the logic function of the gate, can easily be implemented by individual designers analyzing individual gates, as described herein. In addition, the capacitance reduction techniques described herein can be incorporated into gate instantiation software tools that use computers to generate gate schematics based upon a description of a gate's desired logic function, gate inputs, and gate outputs. These software tools are typically run on computer workstations such as that shown in FIG. 7 (reference 702) that are either standalone workstations, or workstations connected together in a network 300 that may also include various peripheral devices such as a network storage device 308. As shown in FIG. 7, typical computer workstation 702 includes internal storage media such as RAM 718 and external storage media such as a floppy disk 714. The parasitic capacitance reduction techniques described herein can be encoded into instructions stored on a network storage device, in RAM, on a floppy disk, or on other computer storage media, and executed by the computer in connection with the computerized generation of gate designs.

In summary, the present invention comprises a logic device with improved capacitance isolation, and a design methodology that reduces parasitic capacitance, allowing designers to achieve specific design timing and output goals with smaller circuits. The logic device further comprises a virtual ground node, a plurality of input signals, and two or more discharge paths. Each discharge path includes an evaluate node, one or more transistors wherein each transistor is gated by one of the input signals, and one or more intermediate nodes, one of which is coupled to the virtual ground node. In one embodiment, each input signal further comprises an input wire of one or more N-NARY input signals. In one embodiment, the discharge paths are perfectly isolated from each other during the evaluation cycle for every possible combination of the input signals. In another embodiment, the discharge paths further comprise an evaluation path and a non-evaluation path. In this embodiment, the non-evaluation path further comprises an evaluate node and at least two intermediate nodes where one of the intermediate node is coupled to the virtual ground node. During the evaluation cycle for at least one combination of said input signals, the evaluate node of the non-evaluation path is electrically isolated from the evaluation path and the two intermediate nodes are electrically coupled to the evaluation path.

Other embodiments of the invention will be apparent to those skilled in the art after considering this specification in conjunction with the N-NARY Patent or after practicing the disclosed invention. The specification and examples above are exemplary only, with the true scope of the invention being indicated by the following claims.

We claim the following invention:

1. A logic circuit having improved capacitance isolation, comprising:
    a virtual ground node;
    a plurality of inputs, wherein each input further comprises a single wire of one or more 1-of-N input signals; and
    two or more discharge paths, each discharge path further comprises an evaluate node, one or more transistors wherein each transistor is gated by one of said plurality of inputs, and one or more intermediate nodes, wherein one of said intermediate nodes is coupled to said virtual ground node.

2. The logic circuit of claim 1, wherein said discharge paths are perfectly isolated from each other during the evaluation cycle for every possible combination of said inputs.

3. The logic circuit of claim 1, wherein said two or more discharge paths further comprise an evaluation path and a non-evaluation path, said non-evaluation path further comprises an evaluate node and at least a first intermediate node and a second intermediate node wherein said second intermediate node is coupled to said virtual ground node, and during the evaluation cycle for at least one combination of said inputs, said evaluate node of said non-evaluation path is electrically isolated from said evaluation path and said first intermediate node is electrically coupled through said second intermediate node to said evaluation path.

4. A logic system having improved capacitance isolation, comprising:
    a virtual ground node;
    a plurality of inputs, wherein each input further comprises a single wire of one or more 1-of-N input signals; and
    two or more discharge paths, each discharge path further comprises an evaluate node, one or more transistors wherein each transistor is gated by one of said plurality of inputs, and one or more intermediate nodes, wherein one of said intermediate nodes is coupled to said virtual ground node.

5. The logic system of claim 4, wherein said discharge paths are perfectly isolated from each other during the evaluation cycle for every possible combination of said inputs.

6. The logic system of claim 4, wherein said two or more discharge paths further comprise an evaluation path and a non-evaluation path, said non-evaluation path further comprises an evaluate node and at least a first intermediate node and a second intermediate node wherein said second intermediate node is coupled to said virtual ground node, and during the evaluation cycle for at least one combination of said inputs, said evaluate node of said non-evaluation path is electrically isolated from said evaluation path and said first intermediate node is electrically coupled through said second intermediate node to said evaluation path.

7. A method of making a logic circuit having improved capacitance isolation, comprising:
    providing a virtual ground node;
    providing a plurality of inputs, wherein each input further comprises a single wire of one or more 1-of-N input signals; and
    providing two or more discharge paths, each discharge path further comprises an evaluate node, one or more transistors wherein each transistor is gated by one of said plurality of inputs, and one or more intermediate nodes, wherein one of said intermediate nodes is coupled to said virtual ground node.

8. The method of claim 7, wherein said discharge paths are perfectly isolated from each other during the evaluation cycle for every possible combination of said inputs.

9. The method of claim 7, wherein said two or more discharge paths further comprise an evaluation path and a non-evaluation path, said non-evaluation path further comprises an evaluate node and at least a first intermediate node and a second intermediate node wherein said second intermediate node is coupled to said virtual ground node, and during the evaluation cycle for at least one combination of said inputs, said evaluate node of said non-evaluation path is electrically isolated from said evaluation path and said first intermediate node is electrically coupled through said second intermediate node to said evaluation path.

10. A method of reducing parasitic capacitance within a logic circuit, comprising
providing a logic circuit having a virtual ground node, a plurality of inputs, and a plurality of discharge paths, wherein each discharge path further comprises an evaluate node, one or more transistors wherein each transistor is gated by one of said plurality of inputs, and one or more intermediate nodes, each discharge path further comprises an evaluation path for a specific combination of said inputs;
determining whether any of said intermediate nodes within any of said discharge paths can be electrically coupled to an evaluation path under any combination of inputs, and
where a said intermediate node within a said discharge path can be electrically coupled to a said evaluation path, replacing said discharge path with a different but functionally equivalent circuit arrangement comprising a new discharge path having an intermediate node that is either electrically isolated from said evaluation path or electrically coupled to said evaluation path via a common connection at said virtual ground node.

11. The method of claim 10, wherein each input further comprises a single wire of one or more 1-of-N input signals.

12. The method of claim 10, wherein said replacing step further comprises adding an internal evaluate node to said new discharge path and NANDing together said evaluation path and said new discharge path.

13. A program storage device readable by a computer that tangibly embodies a program of instructions executable by the computer to perform a method of reducing parasitic capacitance within a logic circuit, said method comprising:
providing a logic circuit having a virtual ground node, a plurality of inputs, and a plurality of discharge paths, wherein each discharge path further comprises an evaluate node, one or more transistors wherein each transistor is gated by one of said plurality of inputs, and one or more intermediate nodes, each discharge path further comprises an evaluation path for a specific combination of said inputs;
determining whether any of said intermediate nodes within any of said discharge paths can be electrically coupled to an evaluation path under any combination of inputs, and
where a said intermediate node within a said discharge path can be electrically coupled to a said evaluation path, replacing said discharge path with a different but functionally equivalent circuit arrangement comprising a new discharge path having an intermediate node that is either electrically isolated from said evaluation path or electrically coupled to said evaluation path via a common connection at said virtual ground node.

14. The method of claim 13, wherein each input further comprises a single wire of one or more 1-of-N input signals.

15. The program storage device of claim 13, wherein said replacing step further comprises adding an internal evaluate node to said new discharge path and NANDing together said evaluation path and said new discharge path.

* * * * *